(12) United States Patent
Meng et al.

(10) Patent No.: US 11,830,895 B2
(45) Date of Patent: Nov. 28, 2023

(54) DETECTION SUBSTRATE AND RAY DETECTOR

(71) Applicant: BOE Technology Group Co., Ltd., Beijing (CN)

(72) Inventors: Fanli Meng, Beijing (CN); Jiangbo Chen, Beijing (CN); Zeyuan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 23 days.

(21) Appl. No.: 17/764,435

(22) PCT Filed: May 12, 2021

(86) PCT No.: PCT/CN2021/093300
§ 371 (c)(1),
(2) Date: Mar. 28, 2022

(87) PCT Pub. No.: WO2021/254037
PCT Pub. Date: Dec. 23, 2021

(65) Prior Publication Data
US 2022/0375974 A1    Nov. 24, 2022

(30) Foreign Application Priority Data
Jun. 17, 2020 (CN) .......................... 202010552420.6

(51) Int. Cl.
*H01L 27/146* (2006.01)

(52) U.S. Cl.
CPC .. *H01L 27/14612* (2013.01); *H01L 27/14661* (2013.01)

(58) Field of Classification Search
CPC ......... H01L 27/14612; H01L 27/14661; H01L 27/14632; H01L 27/14687; H01L 27/14689
See application file for complete search history.

(56) References Cited

U.S. PATENT DOCUMENTS

| | | | |
|---|---|---|---|
| 10,964,745 B2 * | 3/2021 | Ha | ........................ G01T 1/2006 |
| 11,366,240 B2 * | 6/2022 | Liang | ..................... G01T 1/2018 |
| 2010/0051820 A1 | 3/2010 | Okada | |
| 2012/0080605 A1 | 4/2012 | Kawanabe et al. | |
| 2019/0388042 A1 | 12/2019 | Zhao et al. | |
| 2022/0093658 A1 * | 3/2022 | Chen | ................. H01L 27/14659 |

FOREIGN PATENT DOCUMENTS

| | | |
|---|---|---|
| CN | 102565843 A | 7/2012 |
| CN | 109863599 A | 6/2019 |
| CN | 111653581 A | 9/2020 |

* cited by examiner

*Primary Examiner* — Seung C Sohn
(74) *Attorney, Agent, or Firm* — IPro, PLLC

(57) ABSTRACT

The embodiments of the present disclosure provide a detection substrate and a ray detector, comprising a base substrate; a direct-conversion photosensitive device located on the base substrate; an indirect-conversion photosensitive device located between the base substrate and the layer where the direct-conversion photosensitive device is located; and a reading transistor located between the base substrate and the layer where the indirect-conversion photosensitive device is located. The reading transistor is electrically connected to the direct-conversion photosensitive device and the indirect-conversion photosensitive device respectively.

20 Claims, 3 Drawing Sheets

DETECTION SUBSTRATE AND RAY DETECTOR

CROSS-REFERENCE TO RELATED APPLICATIONS

The present disclosure is a national phase entry under 35 U.S.C. § 371 of International Application No. PCT/CN2021/093300, filed on May 12, 2021, which claims priority of Chinese Patent Application No. 202010552420.6, filed with the China National Intellectual Property Administration (CNIPA) on Jun. 17, 2020, and entitled "DETECTION SUBSTRATE AND RAY DETECTOR", the entire content of which is incorporated herein by reference.

FIELD

The present disclosure relates to the technical field of photoelectric detection, in particular to a detection substrate and a ray detector.

BACKGROUND

An X-ray detection technology is widely applied to fields of industrial non-destructive testing, container scanning, circuit board inspection, medical treatment, security, industry and the like, and has broad application prospects. A traditional X-ray imaging technology belongs to analog signal imaging, the resolution is low, and image quality is poor. Digital Radio Graphy (DR), which appeared in the late 1990s, uses an X-ray flat panel detector to directly convert X images into digital images, becomes the dominant direction of a digital X-ray photography technology by means of the remarkable advantages of convenient operation, high imaging speed, high imaging resolution, clear converted digital images, easy preservation and transmission of digital images and the like, and has been recognized by clinical institutions and imaging experts all over the world.

SUMMARY

In one aspect, embodiments of the present disclosure provide a detection substrate, including:
a base substrate;
a direct-conversion photosensitive device on the base substrate;
an indirect-conversion photosensitive device, located between the base substrate and a layer where the direct-conversion photosensitive device is located; and
a reading transistor between the base substrate and a layer where the indirect-conversion photosensitive device is located.

The reading transistor is electrically connected to the direct-conversion photosensitive device and the indirect-conversion photosensitive device respectively.

Optionally, in the detection substrate provided by the embodiments of the present disclosure, the direct-conversion photosensitive device includes a direct-conversion material layer, a first electrode on a side, facing away from the layer where the indirect-conversion photosensitive device is located, of the direct-conversion material layer, and a second electrode between the direct-conversion material layer and the layer where the indirect-conversion photosensitive device is located.

The first electrode is configured to load a first bias voltage, and the second electrode is electrically connected with a source of the reading transistor.

Optionally, in the detection substrate provided by the embodiments of the present disclosure, in a direction perpendicular to the base substrate, a thickness of the direct-conversion material layer is 100 μm-2000 μm.

Optionally, the detection substrate provided by the embodiments of the present disclosure further includes a scintillator layer between the layer where the direct-conversion photosensitive device is located and the layer where the indirect-conversion photosensitive device is located.

The indirect-conversion photosensitive device is an MSM-type photosensitive device, and includes: a semiconductor layer between the scintillator layer and a layer where the reading transistor is located, a dielectric layer between the semiconductor layer and the layer where the reading transistor is located, and a third electrode and a fourth electrode which are located between the dielectric layer and the layer where the reading transistor is located and are arranged on the same layer.

The third electrode and the fourth electrode form an interdigitated electrode. The third electrode is configured to load a second bias voltage, and the fourth electrode is electrically connected with the source of the reading transistor.

Optionally, in the detection substrate provided by the embodiments of the present disclosure, the second electrode is electrically connected with the source of the reading transistor through the fourth electrode.

Optionally, the detection substrate provided by the embodiments of the present disclosure further includes: a scintillator layer on a side, facing away from a layer where the reading transistor is located, of the base substrate; or a scintillator layer between the base substrate and the layer where the reading transistor is located.

The indirect-conversion photosensitive device is a PIN-type photosensitive device, and includes: a photoelectric conversion layer composed of a P-type semiconductor layer, an intrinsic semiconductor layer and an N-type semiconductor layer which are arranged in a stacked mode, a fifth electrode between the photoelectric conversion layer and the layer where the reading transistor is located, and a sixth electrode on one side, facing away from the layer where the reading transistor is located, of the photoelectric conversion layer.

The fifth electrode is configured to load a third bias voltage, and the sixth electrode is electrically connected with the source of the reading transistor.

Optionally, in the detection substrate provided by the embodiments of the present disclosure, the second electrode and the sixth electrode are of an integrated structure.

Optionally, in the detection substrate provided by the embodiments of the present disclosure, an orthographic projection of the direct-conversion photosensitive device on the base substrate completely covers an orthographic projection of the indirect-conversion photosensitive device and an orthographic projection of the reading transistor.

Optionally, the detection substrate provided by the embodiments of the present disclosure further includes: a thin film packaging layer on one side, facing away from the layer where the indirect-conversion photosensitive device is located, of the layer where the direct-conversion photosensitive device is located.

Optionally, the detection substrate provided by the embodiments of the present disclosure further includes: a seventh electrode arranged on the same layer as a gate of the reading transistor, and the seventh electrode and the source of the reading transistor form a storage capacitor.

In another aspect, embodiments of the present disclosure further provide a ray detector, including the above detection substrate.

DETAILED DESCRIPTION OF THE EMBODIMENTS

Figure 1:
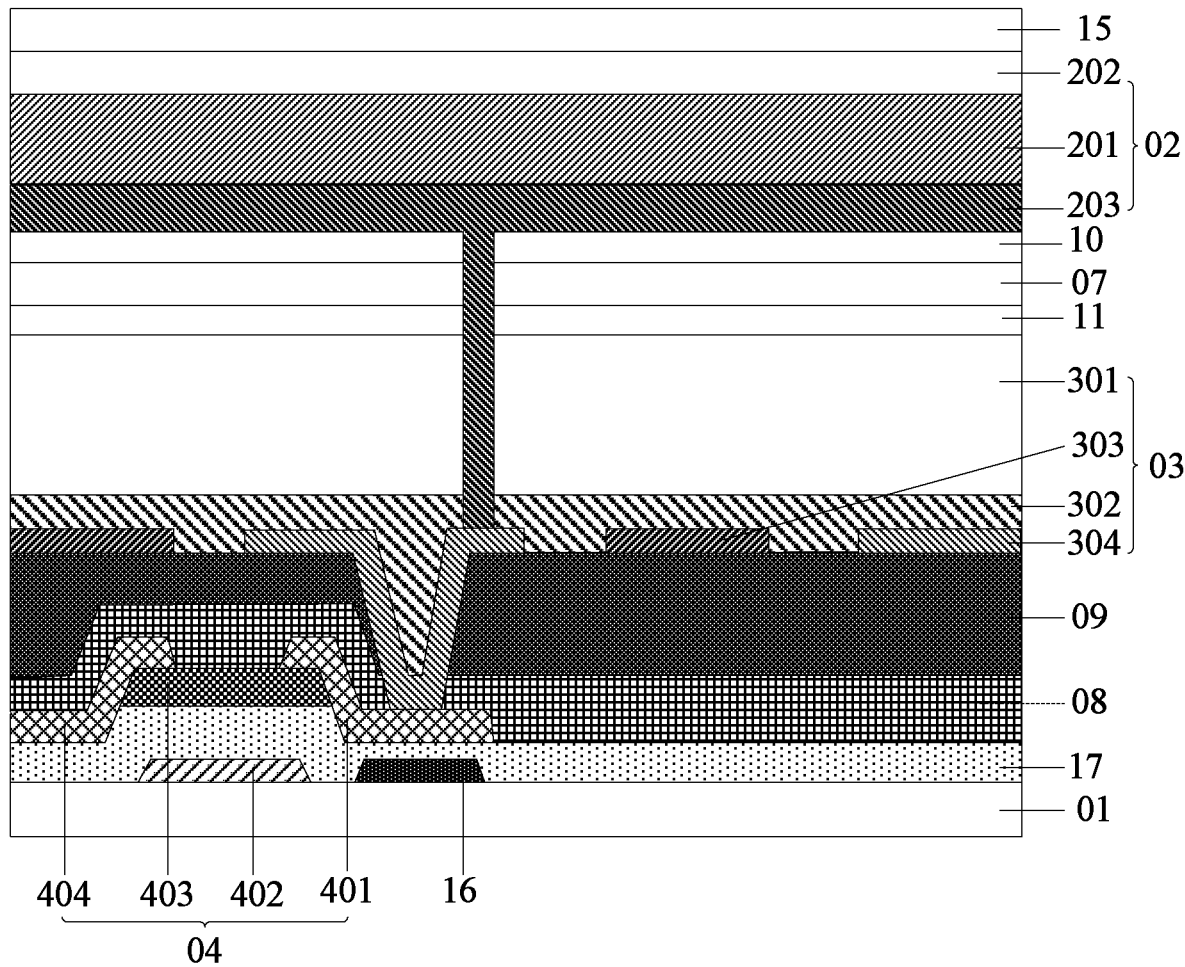
FIG. 1 is a schematic sectional view of a detection pixel in a detection substrate provided by an embodiment of the present disclosure.

In order to make the purpose, technical solutions and advantages of the embodiments of the present disclosure clearer, the technical solutions of the embodiments of the present disclosure will be clearly and completely described below with reference to the accompanying drawings of the embodiments of the present disclosure. The thickness and shape of each film layer in the accompanying drawings do not reflect the true ratio, and the purpose is only to illustrate the content of the present disclosure schematically. Obviously, the described embodiments are some, but not all, embodiments of the present disclosure. Based on the embodiments in the present disclosure, all other embodiments acquired by those of ordinary skill in the art without creative work shall fall within the protection scope of the present disclosure.

Unless otherwise defined, technical or scientific terms used herein should have the ordinary meaning as understood by one of ordinary skill in the art to which this disclosure belongs. The terms "first", "second" and the like used in the description and claims of the present disclosure do not denote any order, quantity or importance, but are only used to distinguish different components. "Comprise" or "include" and similar words mean that the elements or objects appearing before the word encompass the elements or objects recited after the word and their equivalents, but do not exclude other elements or objects. "Inside", "outside", "up", "down" and the like are only used to indicate the relative positional relationship, and when the absolute position of the described object changes, the relative positional relationship may also change accordingly.

In the related art, there are two types of ray detectors based on different conversion methods in a DR technology, one is a direct-conversion detector, and the other is an indirect-conversion detector. In the direct-conversion detector, rays (such as X-rays, γ-rays or other rays) are converted into photocurrents by direct conversion materials. The direct-conversion detector has the advantage of a high modulation transfer function (MTF), that is, high resolution. The greater the MTF value, the stronger the ability of the ray detector to reproduce the details of an imaging object, which is more conductive to high-resolution detection, such as breast and cardiovascular detection. However, the working voltage of direct-conversion detector is usually hundreds to thousands of volts, which has great requirements for equipment power supply, safety protection and energy consumption. In the indirect-conversion detector, the rays are first transformed into visible light through a scintillator layer, and then into photocurrents through a photodiode. The indirect-conversion detector has the advantages of low working voltage, good stability, large working temperature range, high quantum detection efficiency (DQE), high sensitivity and the like. However, after the rays (themselves are collimated) are converted through the scintillator layer, due to the scattering of the visible light by grain boundaries in the scintillator layer, the visible light emitted from the scintillator layer is actually divergent to a certain extent, resulting in crosstalk between adjacent detection pixels. Therefore, compared with the direct-conversion detector, the MTF of the indirect-conversion detector is lower.

In view of the above problems in the related art, embodiments of the present disclosure provide a detection substrate, as shown in FIG. 1, including:
  a base substrate 01;
  a direct-conversion photosensitive device 02 on the base substrate 01;
  an indirect-conversion photosensitive device 03 between the base substrate 01 and a layer where the direct-conversion photosensitive device 02 is located; and
  a reading transistor 04 between the base substrate 01 and a layer where the indirect-conversion photosensitive device 03 is located.

The reading transistor 04 is electrically connected to the direct-conversion photosensitive device 02 and the indirect-conversion photosensitive device 03 respectively.

In each detection pixel of the above detection substrate provided by the embodiments of the present disclosure, the direct-conversion photosensitive device 02 and the indirect-conversion photosensitive device 03 are both arranged, the two types of photosensitive devices are electrically connected with the same reading transistor 04, so that when rays irradiate the detection substrate, part of the rays may be absorbed by the direct-conversion photosensitive device 02, the rest of the rays may be absorbed by the indirect-conversion photosensitive device 03, and the photocurrents generated by the two absorptions together flow into the reading transistor 04. On the one hand, since the absorptivity of the direct-conversion photosensitive device 02 to the rays is positively related to the thickness of a direct-conversion material layer 201 contained in the direct-conversion photosensitive device 02, generally, on the premise that the material remains unchanged, the greater the thickness of the direct-conversion material layer 201, the stronger its ability to absorb the rays. In the present disclosure, in order to allow the indirect-conversion photosensitive device 03 to absorb part of the rays, it is necessary to set the thickness of the direct-conversion material layer 201 contained in the direct-conversion photosensitive device 02 to be less than or equal to the thickness required for the direct-conversion photosensitive device to fully absorb the rays (subject to the absorption rate specification of products on the market). In addition, the electric field intensity (namely the ratio of a bias voltage to the thickness of the direct-conversion material layer 201) in the direct-conversion material layer 201 needs to be maintained at a certain value in order to effectively convert the rays into the photocurrents. Therefore, the voltage required for direct conversion can be reduced to a certain extent in the present disclosure. On the other hand, due to the existence of direct-conversion photosensitive device, it may have higher MTF than an indirect-conversion detector in the related art. To sum up, the ray detector provided by the present disclosure may be tuned between the MTF and the working voltage to achieve a better balance between the two.

Figure 2:
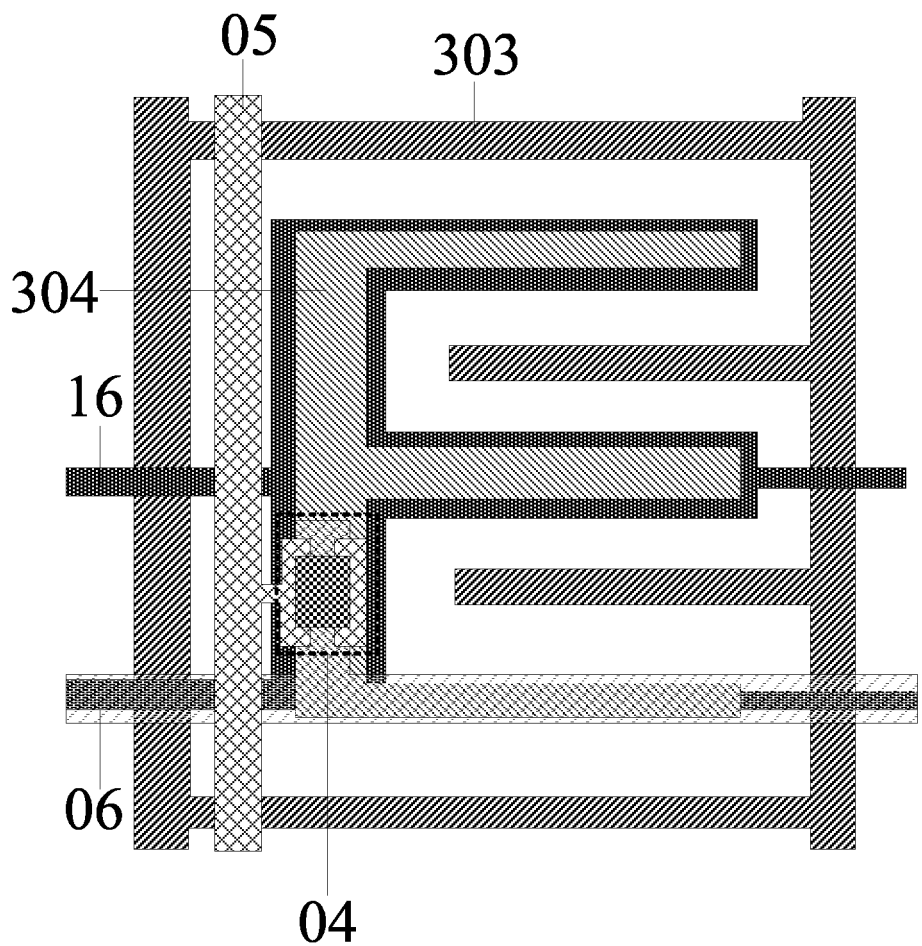
FIG. 2 is a schematic top view of the detection substrate shown in FIG. 1.

Specifically, in the detection substrate provided by the embodiments of the present disclosure, the base substrate 01 may be a glass substrate. The reading transistor 04 includes a source 401, a gate 402, an active layer 403 and a drain 404, and a material of the active layer 403 may be amorphous silicon (a-Si), an indium gallium zinc oxide (IGZO), low-temperature polysilicon (LTPS) and the like. In addition, as shown in FIG. 2, the reading transistor 04 is controlled to be turned on through a scanning line 06, and a photocurrent read by the reading transistor 04 is written into an external circuit through a reading line 05. In order to reduce the coupling capacitance, a line width at the overlapping position of the scanning line 06 and a third electrode 303 may be set to be less than a line width at other positions.

Optionally, in the detection substrate provided by the embodiments of the present disclosure, as shown in FIG. 1, the direct-conversion photosensitive device 02 includes: a direct-conversion material layer 201; a first electrode 202, located on one side, facing away from a layer where the indirect-conversion photosensitive device 03 is located, of the direct-conversion material layer 201; and a second electrode 203, located between the direct-conversion material layer 201 and the layer where the indirect-conversion photosensitive device 03 is located. The first electrode 202 is configured to load a first bias voltage, and the second electrode 203 is electrically connected with the source 401 of the reading transistor 04.

Specifically, the direct-conversion material layer 201 includes amorphous selenium, cadmium telluride, cadmium zinc telluride, lead iodide, polycrystalline mercury iodide, lead oxide, perovskite-based materials and the like. The electric field intensity (specifically, the ratio of the first bias voltage to the thickness of the direct-conversion material layer 201) in the direct-conversion material layer 201 needs to maintain a certain value in order to effectively convert the rays into the photocurrents. Moreover, the electric field intensity requirements of the direct-conversion material layer 201 for different materials are different. For example, the electric field intensity requirements of mercury iodide ($HgI_2$) are 1 V/μm. In the present disclosure, when the thickness of mercury iodide is 100 μm, the applied first bias voltage is 100 V. For another example, the electric field intensity requirements of amorphous selenium (aSe) are 10 V/μm, and in the present disclosure, when the thickness of the amorphous selenium is 50 μm, the first bias voltage of 500 V needs to be applied. In the related art, the mercury iodide needs to be at least 200 μm thick to fully absorb RQAS standard X-rays, and the first bias voltage of at least 200 V needs to be applied; and the amorphous selenium needs to be at least 100 μm thick to fully absorb the RQAS standard X-rays, and the first bias voltage of at least 1000 V needs to be applied. It is apparent that in the present disclosure, the direct-conversion material layer 201 only absorbs part of the rays, and the rest of the rays are absorbed and converted by the indirect-conversion photosensitive device 03. Therefore, the thickness of the direct-conversion material layer 201 can be reduced to reduce the first bias voltage applied to the direct-conversion photosensitive device 02.

Generally, the first electrode 202 is an electrode made of transparent conductive materials such as ITO and IZO, and the second electrode 203 is an electrode made of metals or alloys such as Cu, Al and Mo.

Optionally, in the detection substrate provided by the embodiments of the present disclosure, in a direction perpendicular to the base substrate 01, a thickness of the direct-conversion material layer 201 is 100 μm-2000 μm, for example, 100 μm, 500 μm, 1000 μm, 1500 μm, 2000 μm and the like.

It should be understood that in the present disclosure, the thickness of the direct-conversion material layer 201 is slightly less than that of the direct-conversion material layer 201 of the same material in the related art, so that the direct-conversion photosensitive device 02 and the indirect-conversion photosensitive device 03 jointly convert all rays into the photocurrents.

Optionally, the detection substrate provided by the embodiments of the present disclosure, as shown in FIG. 1, further includes a scintillator layer 07, and the scintillator layer 07 is located between a layer where the direct-conversion photosensitive device 02 is located and a layer where the indirect-conversion photosensitive device 03 is located.

The indirect-conversion photosensitive device 03 is an MSM-type photosensitive device, and includes: a semiconductor layer 301 located between the scintillator layer 07 and a layer where the reading transistor 04 is located, a dielectric layer 302 located between the semiconductor layer 301 and the layer where the reading transistor 04 is located, and a third electrode 303 and a fourth electrode 304 which are located between the dielectric layer 302 and the layer where the reading transistor 04 is located and are arranged on the same layer. The third electrode 303 and the fourth electrode 304 form an interdigitated electrode (as shown in FIG. 2); and the third electrode 303 is configured to load a second bias voltage, and the fourth electrode 304 is electrically connected with the source 401 of the reading transistor 04.

The scintillator layer 07 located between the layer where the direct-conversion photosensitive device 02 is located and the layer where the indirect-conversion photosensitive device 03 is located may convert the rays not absorbed by the direct-conversion photosensitive device 02 into visible light, and the visible light is absorbed by the MSM-type photosensitive device below the scintillator layer 07 to form the photocurrents to be written into the reading transistor 04.

Optionally, in the detection substrate provided by the embodiments of the present disclosure, as shown in FIG. 1, the second electrode 203 is electrically connected with the source of the reading transistor 04 through the fourth electrode 304.

The layer where the reading transistor 04 is located, the layer where the MSM-type photosensitive device is located and the layer where the direct-conversion photosensitive device 02 is located are sequentially arranged on the base substrate 01 in a stacked mode. Generally, in order to improve the stability of the reading transistor 04, a passivation layer 08 needs to be arranged between the reading transistor 04 and the layer where the MSM-type photosensitive device is located. In order to ensure the performance of the MSM-type photosensitive device, a thicker planarization layer 09 needs to be arranged between the passivation layer 08 and the layer where the MSM-type photosensitive device is located. Therefore, the second electrode 203 of the direct-conversion photosensitive device 02 needs to be electrically connected with the reading transistor 04 through a first via hole penetrating through the layer where the MSM-type photosensitive device is located, the passivation layer 08 and the planarization layer 09. The fourth electrode 304 of the MSM-type photosensitive device needs to be electrically connected with the reading transistor 04 through a second via hole penetrating through the passivation layer 08 and the planarization layer 09. However, on the one hand, the more film layers penetrated by the via holes, the more complex the process of forming the via holes (for example, it may be necessary to add a mask hole engraving process to each layer of the penetrated film layers). On the other hand, when the passivation layer 08 and the planarization layer 09 have both the first via hole and the second via hole, the role of the passivation layer 08 and the flat layer 09 may be weakened. In the present disclosure, the second electrode 203 is electrically connected with the source 401 of the reading transistor 04 through the fourth electrode 304, so that a via hole penetrating film layer connected the second electrode 203 with the fourth electrode 304 is less than a first via hole penetrating film layer, and there is only the second via hole in the passivation layer 08 and the planarization layer 09. Therefore, the making process is simplified, and the performance of the ray detector is good.

Generally, the first electrode 303 and the fourth electrode 304 are electrodes made of metals or alloys such as Cu, Al and Mo. The second bias voltage loaded by the third electrode 303 is 5 V-6 V. A first insulating layer 10 is arranged between the second electrode 203 and the scintillator layer 07, and a second insulating layer 11 is arranged between a layer where the third electrode 303 and the fourth electrode 304 are located and the scintillator layer 07.

Figure 3:
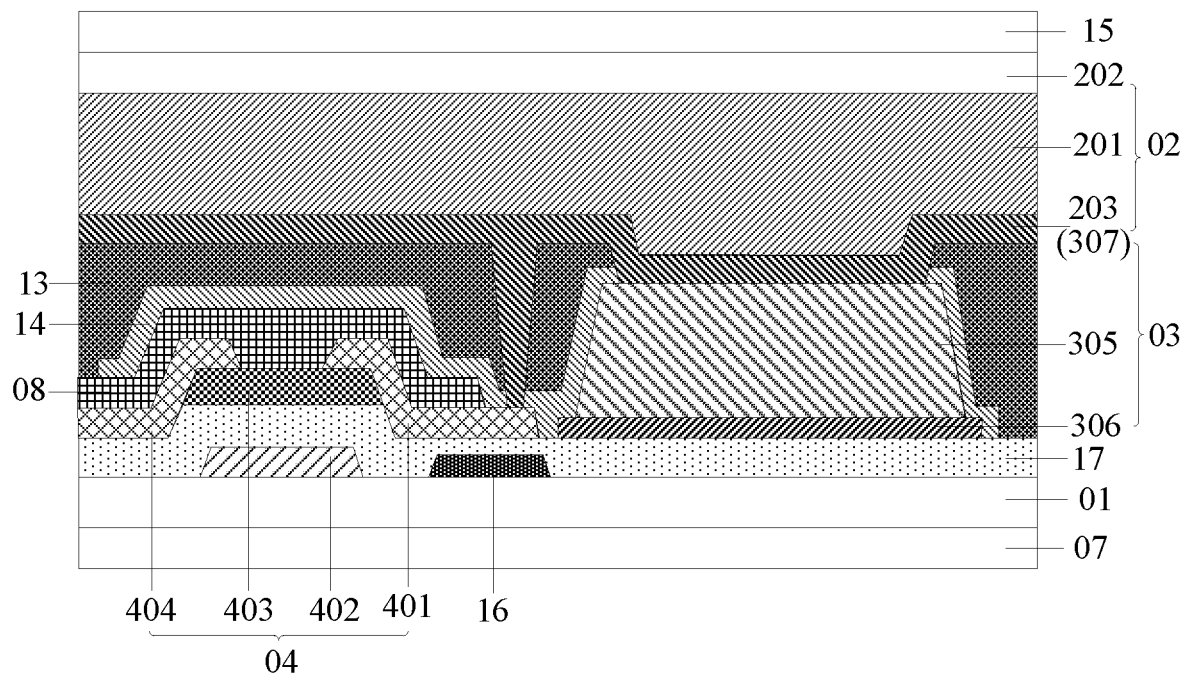
FIG. 3 is another schematic sectional view of a detection pixel in a detection substrate provided by an embodiment of the present disclosure.
Figure 4:
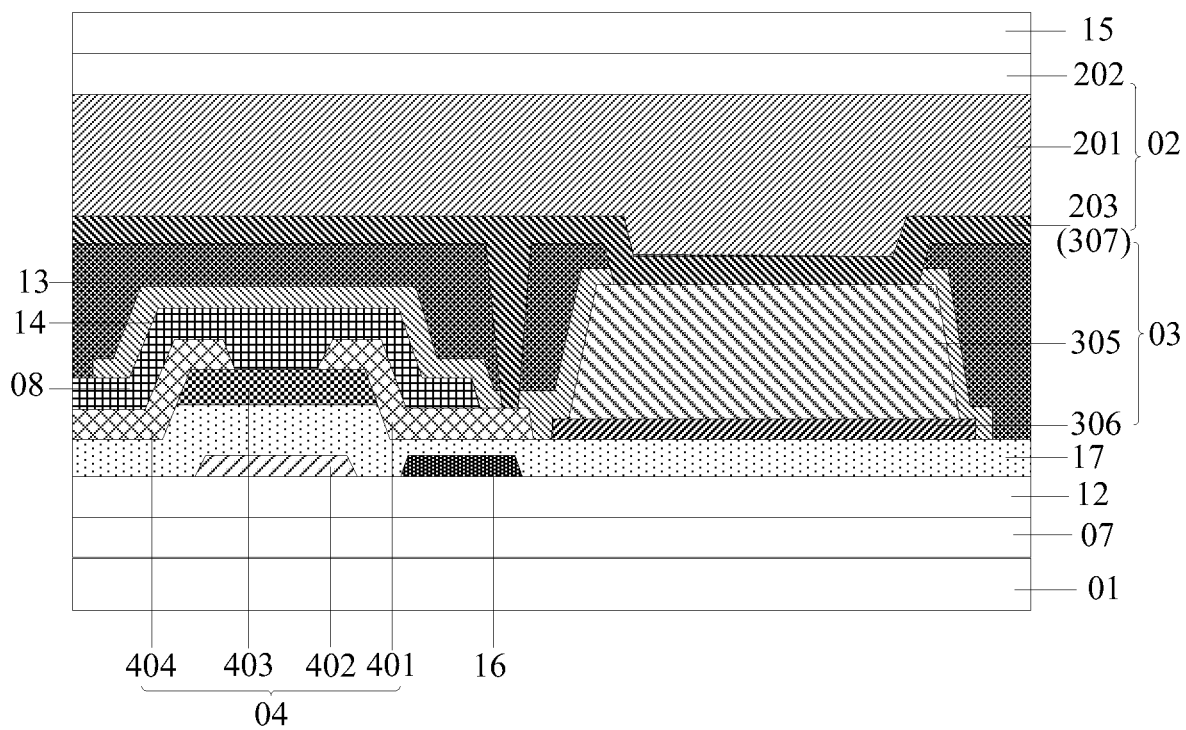
FIG. 4 is yet another schematic sectional view of a detection pixel in a detection substrate provided by an embodiment of the present disclosure.

Optionally, the detection substrate provided by the embodiments of the present disclosure further includes: a scintillator layer 07, the scintillator layer 07 is located on one side, facing away from the layer where the reading transistor 04 is located, of the base substrate 01 (as shown in FIG. 3), or the scintillator layer 07 is located between the base substrate 01 and the layer where the reading transistor 04 is located (as shown in FIG. 4).

The indirect-conversion photosensitive device 03 is a PIN-type photosensitive device, and includes: a photoelectric conversion layer 305 composed of a P-type semiconductor layer, an intrinsic semiconductor layer and an N-type semiconductor layer which are arranged in a stacked mode, a fifth electrode 306 located between the photoelectric conversion layer 305 and the layer where the reading transistor 04 is located, and a sixth electrode 307 located on one side, facing away from the layer where the reading transistor 04 is located, of the photoelectric conversion layer 305. The fifth electrode 306 is configured to load a third bias voltage, and the sixth electrode 307 is electrically connected with the source 401 of the reading transistor 04. An orthographic projection of the photoelectric conversion layer 305 on the base substrate 01 is located within an orthographic projection of the fifth electrode 306 on the base substrate 01, that is, an area of the photoelectric conversion layer 305 is slightly smaller than an area of the fifth electrode 306.

A material of the scintillator layer 07 includes cesium iodide, gadolinium oxysulfide (GOS), tungstate, alkali halide and the like. Due to the properties and thickness of the materials used in the scintillator layer 07, the scintillator layer 07 cannot fully absorb the rays. Generally, the absorption rate of the commercially available materials of the scintillator layer 07 to the rays is about 60%. Therefore, when the rays are irradiated from the bottom of the base substrate 01, the scintillator layer 07 on any side of the base substrate 01 may convert part of the rays into visible light, and the visible light is converted into the photocurrents by the PIN-type photosensitive device and written into the reading transistor 04; and the rest of the rays may penetrate through the layer where the reading transistor 04 is located and a layer where the PIN-type photosensitive device is located to be irradiated to the direct-conversion photosensitive device 02, and be converted into the photocurrents by the direct-conversion photosensitive device 02 and written into the reading transistor 04. Of course, due to the strong penetration of the rays, the rays may also be irradiated on the side where the direct-conversion photosensitive device 02 is located in a specific detection process. In such a case, part of the rays is absorbed and converted into the photocurrents by the direct-conversion photosensitive device 02 and written into the reading transistor 04, the rest of the rays penetrate through respective film layers between the layer where the direct-conversion photosensitive device 02 is located and the scintillator layer 07 and then are irradiated to the scintillator layer 07, it may be converted into the visible light by the scintillator layer 07, and the visible light is converted into the photocurrents by the PIN-type photosensitive device and written into the reading transistor 04.

Generally, a material of the fifth electrode 306 is a transparent material such as ITO and IZO, and the third bias voltage loaded on the fifth electrode is 10 V-30 V. A material of the sixth electrode 307 is a metal or alloy such as Cu, Al and Mo. In addition, when the scintillator layer 07 is located between the base substrate 01 and the layer where the reading transistor 04 is located, a third insulating layer 12 may further be arranged between the scintillator layer 07 and the layer where the reading transistor 04 is located, as shown in FIG. 4.

Optionally, in the detection substrate provided by the embodiments of the present disclosure, the second electrode 203 and the sixth electrode 307 are of an integrated structure.

Since the detection substrate includes a plurality of detection pixels which are arranged in an array, the first electrode 202 contained in the direct-conversion photosensitive device 02 in respective detection pixels jointly forms a block electrode to facilitate the loading of the first bias voltage, but the second electrodes 203 are mutually independent, so as to realize the photocurrent reading of each detection pixel; the fifth electrode 306 contained in the PIN-type photosensitive device in respective detection pixels jointly forms another block electrode to facilitate the loading of the third bias voltage, but the sixth electrodes 307 are mutually independent, so as to realize the photocurrent reading of each detection pixel. In the present disclosure, the second electrode 203 and the fifth electrode 306 are of an integrated structure, so that the fabrication of the second electrode 203 can be realized while forming the fifth electrode 306 of every detection pixel. Therefore, compared with an indirect-conversion detector in the related art, there is no need to add a photo process.

Optionally, as shown in FIG. 3 and FIG. 4, the detection substrate further includes: a resin layer 13 located on one side, facing the photoelectric conversion layer 305, of the sixth electrode 307, and a side wall protection layer 14 located between the resin layer 13 and the photoelectric conversion layer 305. In addition, in order to reduce a distance between the scintillator layer 07 and the photoelectric conversion layer 305, so that loss of the visible light in the transmission process is avoided, an orthographic projection of the passivation layer 08 on the base substrate 01 does not overlap an orthographic projection of the indirect-conversion photosensitive device.

Optionally, in the detection substrate provided by the embodiments of the present disclosure, as shown in FIG. 1, FIG. 3 and FIG. 4, an orthographic projection of the direct-conversion photosensitive device 02 on the base substrate 01 completely covers an orthographic projection of the indirect-conversion photosensitive device 03 and an orthographic projection of the reading transistor 04.

Since the direct-conversion photosensitive device 02 is located at the top layer of the detection substrate, and a ray sensing area of the direct-conversion photosensitive device 02 is a detection pixel area where the whole direct-conversion photosensitive device 02 is located, under the condition that the orthographic projection of the direct-conversion photosensitive device 02 on the base substrate 01 completely covers the orthographic projection of the indirect-conversion photosensitive device 03 and the orthographic projection of the reading transistor 04, the opening rate of the detection pixels can be higher, even close to 100%. Of course, in implementations, the direct-conversion photosensitive device 02 is not limited to the top layer of the detection substrate, and may also be arranged between the indirect-conversion photosensitive device 03 and the reading transistor 04, and the indirect-conversion photosensitive device 03 is arranged at the top layer of the detection substrate, which is not limited here.

Optionally, the detection substrate provided by the embodiments of the present disclosure, as shown in FIG. 1, FIG. 3 and FIG. 4, further includes: a thin film packaging layer 15 located on one side, facing away from the layer where the indirect-conversion photosensitive device 03 is located, of the layer where the direct-conversion photosensitive device 02 is located.

Specifically, the thin film packaging layer 15 may include an inorganic packaging layer and an organic packaging layer, so as to effectively block the invasion of water and oxygen and prevent the damage of water and oxygen to the direct-conversion photosensitive device 02.

Optionally, the detection substrate provided by the embodiments of the present disclosure, as shown in FIG. 1, FIG. 3 and FIG. 4, further includes: a seventh electrode 16 arranged on the same layer as the gate 402 of the reading transistor 04, and the seventh electrode 16 and the source 401 of the reading transistor 04 form a storage capacitor.

Since the process of generating the photocurrents by the direct-conversion photosensitive device 02 and the indirect-conversion photosensitive device 03 is not completed in an instant, the storage capacitor may be arranged to store the photocurrents temporarily. Generally, a gate insulating layer 17 is further arranged between a layer where the gate 402 and the seventh electrode 16 are located and a layer where the source 401 is located, as shown in FIG. 1, FIG. 3 and FIG. 4. In order to increase the storage capacitance, as shown in FIG. 2, an orthographic projection of the seventh electrode 16 on the base substrate 01 and an orthographic projection of the fourth electrode 304 overlap with each other and are similar in shape. Generally, the seventh electrode 16 is grounded, specifically, in order to facilitate grounding, the seventh electrode 16 extends from the overlapping area with the fourth electrode 304 to overlap the third electrode 303, and a width of the overlapping position of the seventh electrode 16 and the third electrode 303 is less than that of the overlapping position with the fourth electrode 304.

Based on the same inventive concept, embodiments of the present disclosure further provide a ray detector, including the above detection substrate provided by the embodiments of the present disclosure. Other essential components of the ray detector should be understood by those skilled in the art, and will not be repeated here, nor should it be regarded as a limitation of the present disclosure. In addition, since the principle of solving the problem of the ray detector is similar to that of the detection substrate, the implementation of the ray detector may refer to the embodiments of the detection substrate, and the repetition will not be described in detail.

Specifically, the process for preparing the detection substrate shown in FIG. 1 and FIG. 2 is as follows.

Step 1: a gate 402 and a seventh electrode 16 which are arranged on the same layer are formed on a base substrate 01, and then a gate insulating layer 17, an active layer 403, a source 401 and a drain 404 which are arranged on the same layer, a passivation layer 08 and a planarization layer 09 are sequentially formed on a layer where the gate 402 and the seventh electrode 16 are located. The source 401, the gate 402, the active layer 403 and the drain 404 form a reading transistor 04. The seventh electrode 16 is grounded and forms a storage capacitor with the source 401 for storing photocurrents. Via holes which penetrate through each other and are exposed of the source 401 are formed in the passivation layer 08 and the planarization layer 09.

Step 2: a third electrode 303 and a fourth electrode 304 which are arranged on the same layer and mutually intersected into an interdigitated electrode, a dielectric layer 302, a semiconductor layer 301, a second insulating layer 11, a scintillator layer 07 and a first insulating layer 10 are sequentially formed on the planarization layer 09. The third electrode 303, the fourth electrode 304, the dielectric layer 302 and the semiconductor layer 301 form an MSM-type photosensitive device (namely an indirect-conversion photosensitive device 03), and the fourth electrode 304 is electrically connected with the source 401; and the dielectric layer 302, the semiconductor layer 304, the second insulating layer 11, the scintillator layer 07 and the first insulating layer 10 are provided with via holes which penetrate through one another and are used for exposing the fourth electrode 304.

Step 3: a second electrode 203, a direct-conversion material layer 201, a first electrode 202 and a thin film packaging layer 15 are sequentially formed on the first insulating layer 10. The second electrode 203, the direct-conversion material layer 201 and the first electrode 202 form a direct-conversion photosensitive device 02, and the second electrode 203 is electrically connected with the fourth electrode 304.

Thus, the detection substrate with the structure shown in FIG. 1 and FIG. 2 is formed.

The process for preparing the detection substrate shown in FIG. 3 is as follows.

Step 1: the scintillator layer 07 is formed on the base substrate 01.

Step 2: the gate 402 and the seventh electrode 16 which are arranged on the same layer are formed on a surface of one side, facing away from the scintillator layer 07, of the base substrate 01, and then the gate insulating layer 17, the active layer 403, the source 401 and the drain 404 which are arranged on the same layer, and a passivation layer 08 are sequentially formed on layers where the gate 402 and the seventh electrode 16 are located. The source 401, the gate 402, the active layer 403 and the drain 404 form the reading transistor 04. The seventh electrode 16 is grounded and forms the storage capacitor with the source 401 for storing the photocurrents. An orthographic projection of the passivation layer 08 on the base substrate 01 is located in an orthographic projection of the reading transistor 04.

Step 3: a fifth electrode 306, a photoelectric conversion layer 305 composed of a P-type semiconductor layer, an intrinsic semiconductor layer and an N-type semiconductor layer which are arranged in a stacked mode, a side wall protection layer 14 and a resin layer 13 are sequentially formed in an area, where the reading transistor 04 is not arranged, of the gate insulating layer 17. The side wall protection layer 14 and the resin layer 13 have a first opening right above the photoelectric conversion layer 305, and have a second opening right above the source 401; and an area of the first opening is less than an area of the photoelectric conversion layer 305, and an area of the second opening is less than an area of the source 401.

Step 4: a sixth electrode 307 and the second electrode 203 which are designed integrally, the direct-conversion material layer 201, the first electrode 202 and the thin film packaging layer 15 are sequentially formed on the resin layer 13. The second electrode 203, the direct-conversion material layer 201 and the first electrode 202 form the direct-conversion photosensitive device 02. The fifth electrode 306, the photoelectric conversion layer 305 and the sixth electrode 307 form a PIN-type photosensitive device (namely an indirect-conversion photosensitive device 03). The second electrode 203 is electrically connected with the source 401 through the second opening; and the sixth electrode 307 is in contact with the photoelectric conversion layer 305 through the first opening.

Thus, the detection substrate with the structure shown in FIG. 3 is formed.

Compared with the detection substrate shown in FIG. 3, the position of the scintillator layer 07 is only changed in the detection substrate shown in FIG. 4, so that the process for preparing the detection substrate shown in FIG. 4 may refer to the process for preparing the detection substrate shown in FIG. 3, which is not repeated here.

The embodiments of the present disclosure provide the detection substrate and the ray detector, including: the base substrate; the direct-conversion photosensitive device located on the base substrate; the indirect-conversion photosensitive device located between the base substrate and the layer where the direct-conversion photosensitive device is located; and the reading transistor located between the base substrate and the layer where the indirect-conversion photosensitive device is located. The reading transistor is electrically connected to the direct-conversion photosensitive device and the indirect-conversion photosensitive device respectively. In the present disclosure, the direct-conversion photosensitive device and the indirect-conversion photosensitive device are both arranged, the two types of photosensitive devices are electrically connected with the same reading transistor, so that when rays irradiate the detection substrate, part of the rays may be absorbed by the direct-conversion photosensitive device, the rest of the rays may be absorbed by the indirect-conversion photosensitive device, and the photocurrents generated by the two absorptions together flow into the reading transistor. On the one hand, since the absorptivity of the direct-conversion photosensitive device to the rays is positively related to the thickness of the direct-conversion material layer contained therein, generally, on the premise that the material remains unchanged, the greater the thickness of the direct-conversion material layer, the stronger its ability to absorb the rays. In the present disclosure, in order to allow the indirect-conversion photosensitive device to absorb part of the rays, it is necessary to set the thickness of the direct-conversion material layer contained in the direct-conversion photosensitive device to be less than or equal to the thickness required for the direct-conversion photosensitive device to fully absorb the rays (subject to the absorption rate specification of products on the market). In addition, the electric field intensity (namely the ratio of a bias voltage to the thickness of the direct-conversion material layer) in the direct-conversion material layer needs to be maintained at a certain value in order to effectively convert the rays into the photocurrents. Therefore, the voltage required for direct conversion can be reduced to a certain extent in the present disclosure. On the other hand, due to the existence of direct-conversion photosensitive device, it may have higher MTF than an indirect-conversion detector in the related art. To sum up, the ray detector provided by the present disclosure may be tuned between the MTF and the working voltage to achieve a better balance between the two.

Obviously, those skilled in the art can make various changes and modifications to the embodiments of the present disclosure without departing from the spirit and scope of the embodiments of the present disclosure. As such, provided that these modifications and variations of the embodiments of the present disclosure fall within the scope of the claims of the present disclosure and their equivalents, the present disclosure is also intended to cover such modifications and variations.

What is claimed is:

1. A detection substrate, comprising:
   a base substrate;
   a direct-conversion photosensitive device on the base substrate;
   an indirect-conversion photosensitive device between the base substrate and a layer where the direct-conversion photosensitive device is located;
   one reading transistor between the base substrate and a layer where the indirect-conversion photosensitive device is located; and
   a scintillator layer between the layer where the direct-conversion photosensitive device is located and the layer where the indirect-conversion photosensitive device is located;
   wherein the one reading transistor is electrically connected to the direct-conversion photosensitive device and the indirect-conversion photosensitive device respectively.

2. The detection substrate according to claim 1, wherein the direct-conversion photosensitive device comprises:
   a direct-conversion material layer;
   a first electrode on a side, facing away from the layer where the indirect-conversion photosensitive device is located, of the direct-conversion material layer; and
   a second electrode between the direct-conversion material layer and the layer where the indirect-conversion photosensitive device is located;
   wherein the first electrode is configured to load a first bias voltage, and the second electrode is electrically connected with a source of the reading transistor.

3. The detection substrate according to claim 2, wherein in a direction perpendicular to the base substrate, a thickness of the direct-conversion material layer is 100 μm-2000 μm.

4. The detection substrate according to claim 2,
   wherein the indirect-conversion photosensitive device is an MSM-type photosensitive device, and comprises:
   a semiconductor layer between the scintillator layer and a layer where the reading transistor is located;
   a dielectric layer between the semiconductor layer and the layer where the reading transistor is located; and
   a third electrode and a fourth electrode which are located between the dielectric layer and the layer where the reading transistor is located and are arranged on the same layer;
   wherein the third electrode and the fourth electrode form an interdigitated electrode; and the third electrode is configured to load a second bias voltage, and the fourth electrode is electrically connected with the source of the reading transistor.

5. The detection substrate according to claim 4, wherein the second electrode is electrically connected with the source of the reading transistor through the fourth electrode.

6. The detection substrate according to claim 1, wherein an orthographic projection of the direct-conversion photosensitive device on the base substrate completely covers an orthographic projection of the indirect-conversion photosensitive device and an orthographic projection of the reading transistor.

7. The detection substrate according to claim 1, further comprising:
a thin film packaging layer on a side, facing away from the layer where the indirect-conversion photosensitive device is located, of the layer where the direct-conversion photosensitive device is located.

8. The detection substrate according to claim 1, further comprising:
a seventh electrode arranged on a same layer as a gate of the reading transistor;
wherein the seventh electrode and the source of the reading transistor form a storage capacitor.

9. A ray detector, comprising a detection substrate; wherein the detection substrate comprises:
a base substrate;
a direct-conversion photosensitive device on the base substrate;
an indirect-conversion photosensitive device between the base substrate and a layer where the direct-conversion photosensitive device is located;
one reading transistor between the base substrate and a layer where the indirect-conversion photosensitive device is located; and
a scintillator layer between the layer where the direct-conversion photosensitive device is located and the layer where the indirect-conversion photosensitive device is located;
wherein the one reading transistor is electrically connected to the direct-conversion photosensitive device and the indirect-conversion photosensitive device respectively.

10. The ray detector according to claim 9, wherein the direct-conversion photosensitive device comprises:
a direct-conversion material layer;
a first electrode on a side, facing away from the layer where the indirect-conversion photosensitive device is located, of the direct-conversion material layer; and
a second electrode between the direct-conversion material layer and the layer where the indirect-conversion photosensitive device is located;
wherein the first electrode is configured to load a first bias voltage, and the second electrode is electrically connected with a source of the reading transistor.

11. The ray detector according to claim 10, wherein in a direction perpendicular to the base substrate, a thickness of the direct-conversion material layer is 100 μm-2000 μm.

12. The ray detector according to claim 10,
wherein the indirect-conversion photosensitive device is an MSM-type photosensitive device, and comprises:
a semiconductor layer between the scintillator layer and a layer where the reading transistor is located;
a dielectric layer between the semiconductor layer and the layer where the reading transistor is located; and
a third electrode and a fourth electrode which are located between the dielectric layer and the layer where the reading transistor is located and are arranged on the same layer;
wherein the third electrode and the fourth electrode form an interdigitated electrode; and the third electrode is configured to load a second bias voltage, and the fourth electrode is electrically connected with the source of the reading transistor.

13. The ray detector according to claim 12, wherein the second electrode is electrically connected with the source of the reading transistor through the fourth electrode.

14. The ray detector according to claim 9, wherein an orthographic projection of the direct-conversion photosensitive device on the base substrate completely covers an orthographic projection of the indirect-conversion photosensitive device and an orthographic projection of the reading transistor.

15. The ray detector according to claim 9, wherein the detection substrate further comprises:
a thin film packaging layer on a side, facing away from the layer where the indirect-conversion photosensitive device is located, of the layer where the direct-conversion photosensitive device is located.

16. The ray detector according to claim 9, wherein the detection substrate further comprises:
a seventh electrode arranged on a same layer as a gate of the reading transistor;
wherein the seventh electrode and the source of the reading transistor form a storage capacitor.

17. A detection substrate, comprising:
a base substrate;
a direct-conversion photosensitive device on the base substrate;
an indirect-conversion photosensitive device between the base substrate and a layer where the direct-conversion photosensitive device is located;
one reading transistor between the base substrate and a layer where the indirect-conversion photosensitive device is located; and
a scintillator layer, located on a side, facing away from a layer where the reading transistor is located, of the base substrate, or located between the base substrate and the layer where the reading transistor is located;
wherein the one reading transistor is electrically connected to the direct-conversion photosensitive device and the indirect-conversion photosensitive device respectively; and
the indirect-conversion photosensitive device is a PIN-type photosensitive device, and comprises:
a photoelectric conversion layer composed of a P-type semiconductor layer, an intrinsic semiconductor layer and an N-type semiconductor layer which are arranged in a stacked mode;
a fifth electrode between the photoelectric conversion layer and the layer where the reading transistor is located; and
a sixth electrode on a side, facing away from the layer where the reading transistor is located, of the photoelectric conversion layer;
wherein the fifth electrode is configured to load a third bias voltage, and the sixth electrode is electrically connected with the source of the reading transistor.

18. The detection substrate according to claim 17, wherein the direct-conversion photosensitive device comprises:
a direct-conversion material layer;
a first electrode on a side, facing away from the layer where the indirect-conversion photosensitive device is located, of the direct-conversion material layer; and a second electrode between the direct-conversion material layer and the layer where the indirect-conversion photosensitive device is located;

wherein the first electrode is configured to load a first bias voltage, and the second electrode is electrically connected with a source of the reading transistor.

19. The detection substrate according to claim 18, wherein the second electrode and the sixth electrode are of an integrated structure.

20. A ray detector, comprising the detection substrate according to claim 17.

* * * * *